United States Patent
Hara et al.

(10) Patent No.: US 10,894,252 B2
(45) Date of Patent: Jan. 19, 2021

(54) PHOTOCATALYTIC MATERIAL AND METHOD FOR FABRICATION THE SAME

(71) Applicant: Panasonic Intellectual Property Management Co., Ltd., Osaka (JP)

(72) Inventors: Kohei Hara, Osaka (JP); Shunsuke Kori, Osaka (JP); Yasuhiro Hashimoto, Nara (JP); Daisuke Ino, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/512,489

(22) Filed: Jul. 16, 2019

(65) Prior Publication Data
US 2019/0336958 A1    Nov. 7, 2019

Related U.S. Application Data
(63) Continuation of application No. PCT/JP2018/001118, filed on Jan. 17, 2018.

(30) Foreign Application Priority Data
Mar. 3, 2017 (JP) ................................ 2017-040101

(51) Int. Cl.
*B01J 37/08* (2006.01)
*B01J 21/06* (2006.01)
(Continued)

(52) U.S. Cl.
CPC .......... *B01J 37/084* (2013.01); *B01J 21/063* (2013.01); *B01J 35/004* (2013.01);
(Continued)

(58) Field of Classification Search
CPC ...... B01J 37/084; B01J 21/063; B01J 35/004; B01J 37/345; B01J 37/0223; B01J 37/0219; C23C 16/26; C23C 16/442
(Continued)

(56) References Cited

U.S. PATENT DOCUMENTS 5,182,016 A * 1/1993 Funkenbusch ........... B01J 20/06
                                              210/198.2
5,965,479 A * 10/1999 Suzuki ..................... B01J 20/06
                                              423/447.5
(Continued)

FOREIGN PATENT DOCUMENTS

| CN | 10 6207118 | * 12/2016 | ............ B82Y 30/00 |
| JP | 1-092373 | 4/1989 | |

(Continued)

OTHER PUBLICATIONS

Alexandru R. Biris et al., "Synthesis of tunable core-shell nanostructures based on TiO2-graphene architectures and their application in the photodegradation of rhodamine dyes." Physica E 81, pp. 326-333. (Year: 2016).*
(Continued)

*Primary Examiner* — Patricia L. Hailey
(74) *Attorney, Agent, or Firm* — McDermott Will and Emery LLP (57) ABSTRACT

Provided is a fabrication method of a photocatalytic material in which a single layer of a carbon-based participate is formed on a surface of each of titanium dioxide particle. The method includes (a) loading titanium dioxide particles into an electric furnace comprising a mechanism for rotating a core tube; (b) heating an inside of the core tube of the electric furnace into which the titanium dioxide particles have been loaded to a temperature of not less than 400° C. and not more than 800° C., while an inert gas is introduced into the inside of the core tube; (c) supplying a hydrocarbon (Continued)

gas to the inside of the core tube in addition to the inert gas; and (d) performing a thermal CVD on each of the titanium dioxide particles in a fluidized state inside the core tube, while the core tube is rotated, to form a single layer of a carbon-based precipitate containing graphene on a surface of each of the titanium dioxide particles. A photocatalyst material is provided.

8 Claims, 5 Drawing Sheets

(51) Int. Cl.
  *B01J 35/00* (2006.01)
  *B01J 37/02* (2006.01)
  *B01J 37/34* (2006.01)
  *C23C 16/26* (2006.01)

(52) U.S. Cl.
  CPC ......... *B01J 37/0223* (2013.01); *B01J 37/345* (2013.01); *C23C 16/26* (2013.01)

(58) Field of Classification Search
  USPC .............. 502/182, 350; 427/212, 213, 249.1, 427/249.6; 977/773, 811; 428/403
  See application file for complete search history.

(56) References Cited

U.S. PATENT DOCUMENTS

| | | | | |
|---|---|---|---|---|
| 6,306,343 | B1* | 10/2001 | Sugiyama | B01J 21/063 |
| | | | | 422/4 |
| 7,524,791 | B2* | 4/2009 | Furuya | C22C 14/00 |
| | | | | 502/180 |
| 9,981,247 | B2* | 5/2018 | Chopra | B01J 21/18 |
| 2009/0068470 | A1* | 3/2009 | Choi | B82Y 30/00 |
| | | | | 428/403 |
| 2012/0077020 | A1* | 3/2012 | Muramatsu | H01M 4/625 |
| | | | | 428/319.1 |
| 2014/0021589 | A1* | 1/2014 | Kang | H01L 21/0228 |
| | | | | 257/635 |
| 2017/0348672 | A1* | 12/2017 | Hara | B01J 21/063 |

FOREIGN PATENT DOCUMENTS

| | | |
|---|---|---|
| JP | 2003-252613 | 9/2003 |
| JP | 2015-229619 | 12/2015 |
| KR | 10-2013-0113770 | 10/2013 |

OTHER PUBLICATIONS

M. A. Nawi et al., "Preparation and characterization of TiO2 coated with a thin carbon layer for enhanced photocatalytic activity under fluorescent lamp and solar light irradiations." Applied Catalysis A: General 453, pp. 80-91. (Year: 2013).*

International Search Report of PCT application No. PCT/JP2018/001118 dated Mar. 20, 2018.

Yajun Wang et al., "Significant photocatalytic enhancement in methylene blue degradation of TiO2 photocatalysts via graphene-like carbon in situ hybridization", Applied Catalysis B: Environmental, 2010, vol. 100, Aug. 1, 2010, pp. 179-183.

The Extended European Search Report dated Feb. 10, 2020 for the related European Patent Application No. 18761074.6.

Nannan Wang et al: "A generic method to synthesise graphitic carbon coated nanoparticles in large scale and their derivative polymer nanocomposites", Scientific Reports,vol. 7, No. 1, Sep. 19, 2017 (Sep. 19, 2017), XP055663769.

Malgorzata Wojtoniszak et al: "Carbon-modified Ti02 for photocatalysis", Nanoscale Research Letters,vol. 7. No. 1, Apr. 26, 2012 (Apr. 26, 2012),p. 235, XP055663577.

Alicja Bachmatiuk et al: "Few-Layer Graphene Shells and Non-magnetic Encapsulates: A Versatile and Nontoxic Carbon Nanomaterial", ACS NANO,vol. 7, No. 12. Nov. 12, 2013 (Nov. 12, 2013). 10552-105621 XP055663756.

Gengpng Wan et al: "Preparation and microwave absorption properties of uniformTi02@C core-shell nanocrystals", RSC Advances,vol. 5, No. 94, Sep. 8, 2015 (Sep. 8, 2015). pp. 77443-77448, XP055663750.

Biris Alexandru R et al: "Synthesis of tunable core-shell nanostructures based onTi02-graphene architectures and their application in the photodegradation of rhodamine dyes", Physica E-Low-Dimensional Systems Andnanostructures, Elsevier Science BV, NL,vol. 81, Mar. 18, 2016 (Mar. 18, 2016), pp. 326-333, XP029545080.

Fang Xu et al: "Multi-walled carbon/IF-WS2 nanoparticles with improved thermal properties",NANOSCALE,vol. 5, No. 21, Aug. 16, 2013 (Aug. 16, 2013), pp. 10504-10510, XP055663922.

Fang Xu et al: "Supporting information of Multi-wall Carbon IF-WS2 Nanoparticles with Improved Thermal Properties", Nanoscale,Aug. 16, 2013 (Aug. 16, 2013). pp. 1-5, XP055664003.

* cited by examiner

FIG. 1

Magnification: 7,000,000

PHOTOCATALYTIC MATERIAL AND METHOD FOR FABRICATION THE SAME

BACKGROUND

1. Technical Field

The present disclosure relates to a photocatalytic material.

2. Description of the Related Art

Currently, titanium dioxide particles are widely used as a photocatalyst. In order to improve performance of the titanium dioxide particles as the photocatalyst, it has been studied to coat a surface of the titanium dioxide particles with a carbon-based precipitate.

For example, as a prior art relative to a composite of titanium dioxide and graphene, a sol-gel reaction is allowed to proceed while a release agent is added to a suspension in which titanium alkoxide and graphite powder have been mixed, and then, the dispersion is dried to provide the composite of titanium dioxide and graphene (see Patent Literature 1).

In addition, for example, as a method of forming a carbon thin film on the surface of the fine particle, there is also a method of using an electric furnace provided with a mechanism for rotating a reaction tank. In the method, the surface of the particles is coated with a uniform carbon thin film by performing CVD (Chemical Vapor Deposition) while fine particles flows in the reaction tank (see Patent Literature 2).

As described above, by coating the surface of the titanium dioxide particles with the carbon-based precipitate, improvement in catalytic activity and chemical durability can be expected.

CITATION LIST

Patent Literature

Patent Literature 1: Japanese Unexamined Patent Application Publication No. 2015-229619
Patent Literature 2: Japanese Patent Publication No. 2590937

SUMMARY

Technical Problem

However, for practical use of the photocatalytic material, further improvement in the catalytic activity has been required.

Solution to Problem

One aspect of a fabrication method of a photocatalytic material to solve the above problem includes (a) loading titanium dioxide particles into an electric furnace comprising a mechanism for rotating a core tube; (b) heating an inside of the core tube of the electric furnace into which the titanium dioxide particles have been loaded to a temperature of not less than 400° C. and not more than 800° C., while an inert gas is introduced into the inside of the core tube; (c) supplying a hydrocarbon gas to the inside of the core tube in addition to the inert gas; and (d) performing a thermal CVD on each of the titanium dioxide particles in a fluidized state inside the core tube, while the core tube is rotated, to form a single layer of a carbon-based precipitate containing graphene on a surface of each of the titanium dioxide particles.

Advantageous Effect

In the above aspect, further improvement in the catalytic activity of the photocatalytic material can be realized.

DETAILED DESCRIPTION OF THE EMBODIMENT

In the composite of titanium dioxide and graphene disclosed in Patent Literature 1, the graphene formed on the surface of titanium dioxide is considered to have a multilayer structure. Therefore, when this composite is used as a photocatalyst, the graphene having a multilayer structure absorbs light to be absorbed by the titanium dioxide, and the light absorption by the titanium dioxide is prevented. Furthermore, for example, in a case of using the composite for the purpose of purifying pollutants in water by photocatalytic reaction, there is a problem that the pollutants are prevented from coming close to the surface of the titanium dioxide to make the purification speed of the pollutants slow.

In addition, in the method of coating a carbon thin film disclosed in Patent Literature 2, when the carbon thin film is coated on the surface of the fine particles, the temperature in the reaction tank is set to 1000° C. to 1600° C. The reason for coating using this temperature range is the suppression of side reactions and the prevention of impurities from being mixed into the produced carbon thin film, and this temperature range is commonly used when a material composed of $sp^2$ hybrid orbital carbon such as graphene or carbon nanotubes is fabricated. Here, in the method of coating the carbon thin film disclosed in Patent Literature 2, the case of using titanium dioxide as fine particles is considered. In the aforementioned temperature range, titanium dioxide is stably present as a rutile-type crystal. However, in order for titanium dioxide to act as a photocatalyst, it is preferable that titanium dioxide is present as an anatase-type crystal. Therefore, even if titanium dioxide is coated with the carbon thin film by the method disclosed in Patent Literature 2, phase transition of the crystal of the titanium dioxide to the rutile type takes place, and there is a problem that the performance as a photocatalyst decreases.

Therefore, in order to improve the catalytic activity of the photocatalyst material, the following improvement measures were examined.

One aspect of the method for fabricating a photocatalytic material comprises (a) loading titanium dioxide particles into an electric furnace comprising a mechanism for rotating a core tube; (b) heating an inside of the core tube of the electric furnace into which the titanium dioxide particles have been loaded to a temperature of not less than 400° C. and not more than 800° C., while an inert gas is introduced into the inside of the core tube; (c) supplying a hydrocarbon gas to the inside of the core tube in addition to the inert gas; and (d) performing a thermal CVD on each of the titanium dioxide particles in a fluidized state inside the core tube, while the core tube is rotated, to form a single layer of a carbon-based precipitate containing graphene on a surface of each of the titanium dioxide particles.

In the above aspect, the photocatalytic material in which the single layer of the carbon-based precipitate containing graphene has been formed on the surface of titanium dioxide particles can be fabricated. By coating the surface of the titanium dioxide particle with the single layer of the carbon-based precipitate containing graphene, when the titanium dioxide particles are irradiated with light to excite electrons, the excited electrons are stabilized by an acceptor level of the carbon-based precipitate covering the surface of the titanium dioxide particle. This suppresses the recombination of excited electron-hole pairs to improve quantum efficiency. In addition, concentration of a substance to be reacted by photocatalytic reaction is increased in the vicinity of the surface of the photocatalyst due to adsorption concentration effect of the reactant by the carbon-based precipitate covering the surface of the titanium dioxide particle. In addition, if the titanium dioxide particle is covered thickly with the carbon-based precipitate, there is a problem that the carbon-based precipitate prevents the titanium dioxide particles from absorbing light, however as in the present disclosure, the carbon-based precipitate covering the titanium dioxide particle is not a multilayer but a single layer to allow the prevention of light absorption to be minimized. Due to these mechanisms, the effect of improving photocatalytic activity is provided.

In the above aspect, the single layer of the carbon-based precipitate may cover at least a part of the surface of the titanium dioxide particle. It is preferable that the single layer of the carbon-based precipitate covers 5 to 40% of the surface of the titanium dioxide particle.

In addition, in another aspect, a photocatalytic material in which the single layer of the carbon-based precipitate containing graphene is formed on the surface of the titanium dioxide particle is provided.

In the above-mentioned aspect, the single layer of the carbon-based precipitate may cover at least a part of the surface of the titanium dioxide particle. It is preferable that the single layer of the carbon-based precipitate covers 5 to 40% of the surface of the titanium dioxide particle.

Hereinafter, the embodiment of the present disclosure will be described with reference to the drawings.

First Embodiment

A method for fabricating a photocatalytic material in the present embodiment will be described below. In the present embodiment, thermal CVD using a rotary electric furnace is performed. The rotary electric furnace used in the present embodiment is provided with a rotation mechanism in which the atmosphere in the inside thereof can be changed and the core tube is rotated about the horizontal rotation axis thereof.

Figure 1:
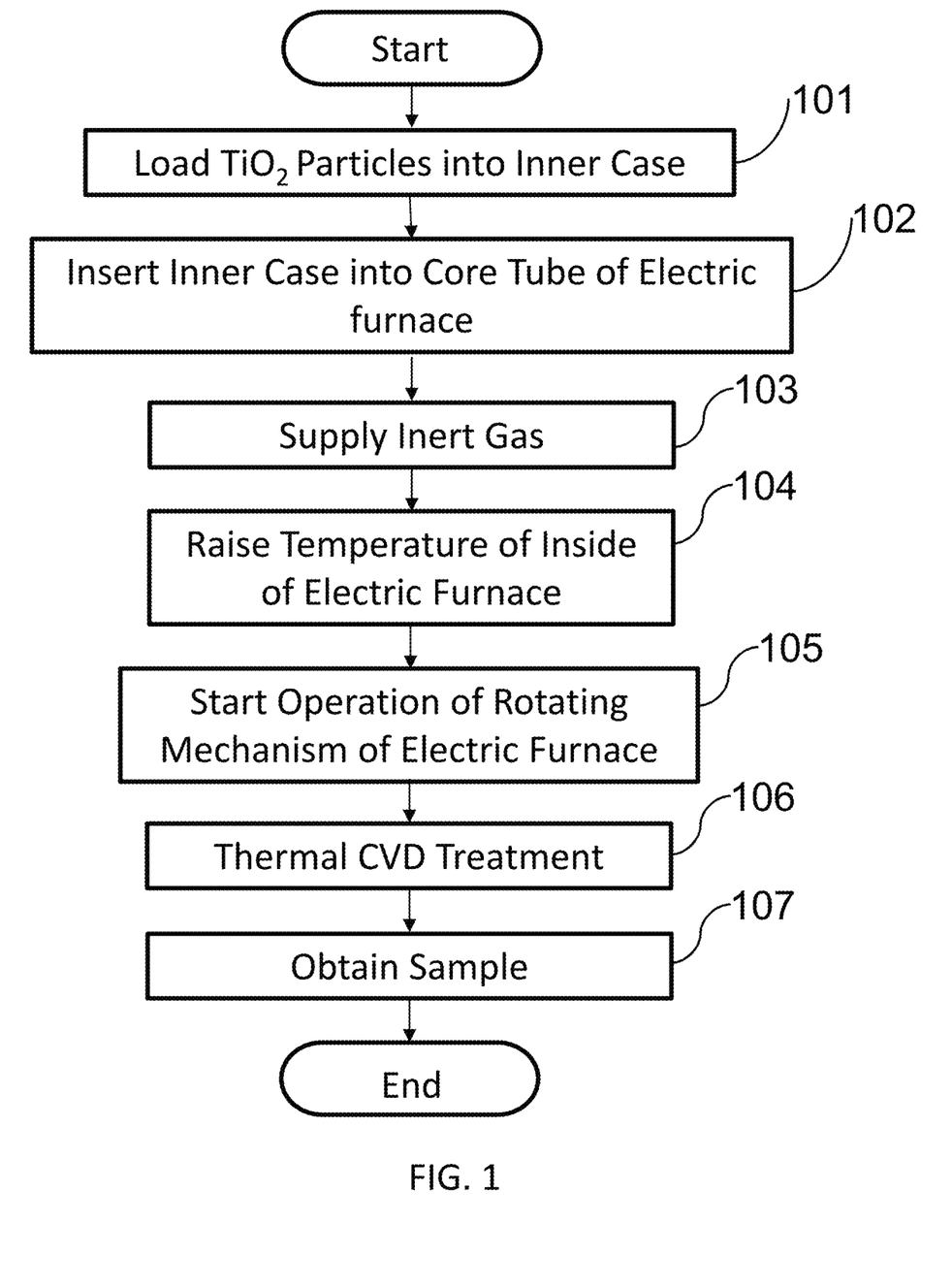
FIG. 1 is a flow chart showing a manufacturing procedure of a photocatalytic material in the first embodiment of the present disclosure.

FIG. 1 is a flow chart showing a procedure for fabricating the photocatalytic material according to the first embodiment.

The production procedure of the photocatalyst material in the present embodiment includes steps 101 to 107. In the step 101, titanium dioxide particles which are used as a starting material of the photocatalytic material are prepared. The prepared titanium dioxide particles are placed in an inner case which is used for insertion into an electric furnace. At this time, the inner case is made of, for example, quartz. In addition, another ceramic inner case stable at 1,000° C. or more may be used. The inner case rotates in accordance with the rotation of the core tube of the electric furnace. As a result, the heat treatment can be performed while the titanium dioxide particles in the inner case are fluidized. The shape of the inner case may be cylindrical, and both ends of the cylinder may be narrowed. Due to this shape, the gas which is introduced into the electric furnace can enter and leave the inner case, and titanium dioxide particles in the inner case are less likely to leak out of the inner case when the inner case rotates. The inner case may have, for example, protrusions and recesses on the inner wall thereof. In addition, the inner case may have other structures to promote the fluidization of the titanium dioxide particles.

Here, in the present embodiment, the titanium dioxide particle which is used as a starting material of the photocatalyst material will be considered. The crystal structure of the titanium dioxide particle may be of anatase, rutile or brookite type. When the titanium dioxide particle is used as a photocatalyst, it is preferable to select the titanium dioxide particle having a crystal structure of anatase-type, which has a high photocatalytic function. In addition, generally, it is believed that the photocatalytic function is higher as the surface area of the photocatalyst particle is larger. Therefore, it is preferable that the titanium dioxide particle used in the present embodiment have small particle size. For example, the titanium dioxide particle having an average particle diameter of not more than 1,000 nm may be used as a starting material of the photocatalyst material of the present embodiment. Here, the average particle size of the titanium dioxide particle is defined as, for example, the average value of the major and minor axes of the titanium dioxide particle. In addition, when the average particle diameter of the titanium dioxide particle is smaller than 1 nm, it is generally believed that the catalytic activity of the titanium dioxide particle is lowered due to quantum size effect. From the viewpoint of the above, it is desirable to use the titanium dioxide particle having an average particle diameter of not less than 1 nm and not more than 1,000 nm as the starting material of the photocatalyst material of the present disclosure.

In the present embodiment, a photocatalytic material was fabricated using a product "P25" manufactured by Degussa Co., Ltd. as titanium dioxide particles. P25 is a trade name of the titanium dioxide particles each having an average particle size of 25 nm.

In the step 101, the titanium dioxide particles are weighed, and the weighed titanium dioxide particles are placed in the inner case from which static electricity has been removed with a charge removal blower.

In the step 102, the inner case is inserted into the core tube of the electric furnace. The inner case containing the titanium dioxide particles is inserted to a heating portion of the core tube of the electric furnace, and gas lines of an inert gas and a starting material gas are connected to the core tube. Here, for example, a nitrogen gas or an argon gas may be used as the inert gas.

In the step 103, the inert gas is introduced into the core tube through the aforementioned gas line. At this time, for example, the inert gas is introduced at a flow rate of 50 mL/min to replace the core tube with an inert atmosphere. The gas in the core tube is replaced with the inert gas to remove carbon other than the starting material gas which will be introduced at the time of CVD from the core tube.

In the step 104, a temperature in the core tube is raised under the inert gas atmosphere. A temperature control program of the electric furnace is operated to heat the titanium dioxide particles contained in the inner case to 400 to 800° C. At this time, for example, the temperature in the core tube may be raised from room temperature to a target temperature at a temperature rising rate of 5° C./min. In the present embodiment, the temperature in the core tube was raised from room temperature to 450° C.

In the step 105, the rotating mechanism of the rotary electric furnace is operated. Here, the rotation mechanism is operated after the temperature rise in the core tube is completed. After the temperature rise is completed, the rotation mechanism is operated to suppress aggregation of the titanium dioxide particles due to the fluidization of the titanium dioxide particles. The uniformity of the carbon-based precipitate formed on the surface of the titanium dioxide particle is improved.

In the step 106, thermal CVD processing is performed on the titanium dioxide particles. First, a gaseous mixture of the starting material gas and the inert gas is introduced into the inside of the core tube. The starting material gas is adsorbed on the surface of titanium dioxide, and thermal decomposition and dehydrogenation occur at a predetermined temperature to form the single layer of the carbon-based precipitate 201 on the surface of titanium dioxide particle. As a result, the titanium dioxide particles each coated with the single layer of carbon-based precipitate 201 containing graphene are provided. Here, as a starting material gas, for example, a hydrocarbon gas containing an alkene such as propylene or an alkane such as methane is used. In addition, for example, a gas provided by bubbling the inert gas into an alcohol such as methanol or ethanol may be used as the starting material gas.

The gaseous mixture of the starting material gas and the inert gas is generated, for example, by mixing a propylene gas at a flow rate of 80 mL/min with a nitrogen gas at a flow rate of 50 mL/min. The thermal CVD processing is performed using this gaseous mixture. The starting material gas is heated to not less than 400° C. in order to form the carbon-based precipitate on the surface of the titanium dioxide particle using the starting material gas. Although the starting material gas is thermally decomposed at not more than 400° C. on the titanium dioxide surface, dehydrogenation of the starting material gas molecules proceeds by heating the starting material gas on the titanium dioxide surface to not less than 400° C. As a result, the highly crystalline carbon-based precipitate containing carbon of $sp^2$ hybrid orbital is formed on the titanium dioxide surface to improve the chemical durability of the photocatalytic material.

On the other hand, when heating over 800° C. is performed, the crystal of the anatase-type titanium dioxide particle is changed to the rutile-type. As described above, when titanium dioxide is used as a photocatalyst, it is preferable to use the anatase-type having high catalytic activity. The rutile-type titanium dioxide has lower catalytic activity then the anatase-type. Therefore, in the process of fabricating the photocatalytic material according to the present embodiment, it is desirable to perform heat treatment on the titanium dioxide particles at a temperature of not more than 800° C. From the above, it is desirable to perform the thermal CVD within a temperature range of not less than 400° C. and not more than 800° C. in the process of fabricating the photocatalytic material according to the present embodiment.

Next, the period during thermal CVD will be described. The thermal CVD is performed for 5 minutes in the present embodiment. The thermal CVD may be performed for 10 minutes, 20 minutes, 30 minutes, or 60 minutes, for example. Here, the period during thermal CVD is the time from the start to the end of the supply of the starting material gas into the core tube of the rotary electric furnace. After completion of the thermal CVD, the supply of the starting material gas and the operation of the rotation mechanism are stopped, and the core tube is naturally cooled under an inert atmosphere.

Finally, in the step 107, the produced photocatalytic material is provided. After the cooling of the core tube and the inner case is completed, the inner case is taken out of the core tube to provide the produced photocatalytic material.

Figure 2:
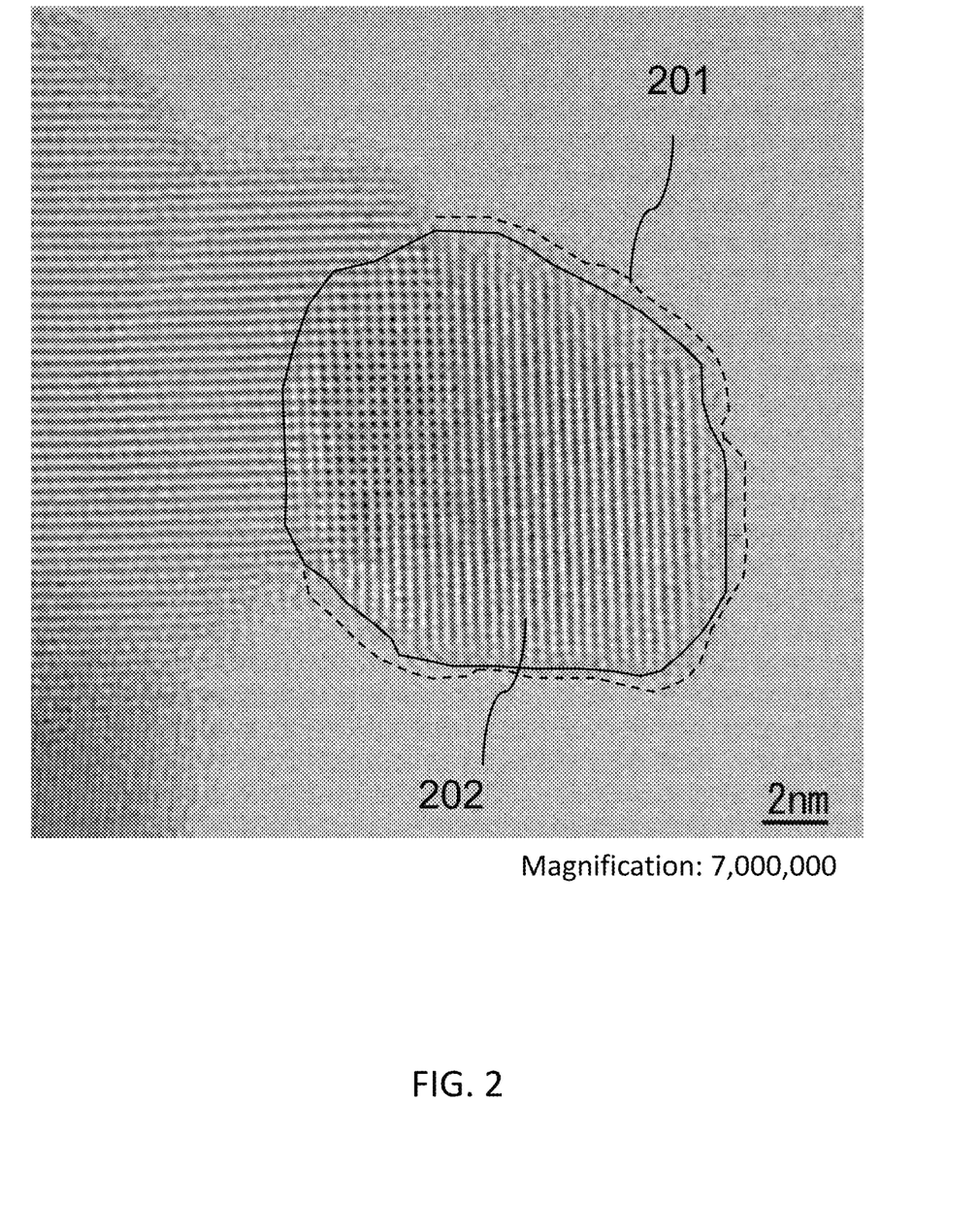
FIG. 2 is a diagram showing an observation result of the photocatalytic material with a transmission electron microscope in the first embodiment of the present disclosure.

FIG. 2 is a diagram showing the observation result of the photocatalytic material with a transmission electron microscope in the first embodiment.

In FIG. 2, the region surrounded by a black line is a titanium dioxide particle 202. The region around the titanium dioxide particle surrounded by a broken line is a single layer of a carbon-based precipitate 201 containing graphene. The titanium dioxide particle 202 is a particle having photocatalytic activity. The region in which the lattice spacing in the anatase-type titanium dioxide can be observed in the vertical direction of the drawing is surrounded by a black line. Here, the lattice spacing of a (101) plane in the anatase-type titanium dioxide is 0.35 nm. The carbon-based precipitate 201 containing graphene surrounded by the black broken line is formed on the surface of the titanium dioxide particle 202. The thickness of the carbon-based precipitate 201 is not more than 0.5 nm, substantially equal to the thickness of one layer of graphene. The carbon-based precipitate 201 on the surface of the titanium dioxide particle 202 is a single layer. Since the titanium dioxide particle 202 and other titanium dioxide particles overlap three-dimensionally with each other in the portion where checkered lines intersect each other, the broken line in the drawing indicates a part where the carbon-based precipitate 201 is identified without overlapping of the particles.

The coverage ratio of the single layer 201 of the carbon-based precipitate containing graphene to the titanium dioxide particle 202 is determined by quantitatively analyzing the weight of the single layer 201 of the carbon-based precipitate on the photocatalyst surface using a thermogravimetric analyzer as below. The titanium dioxide particle and the photocatalytic material are heated in an air atmosphere to determine their weight changes. In the present embodiment, as the thermogravimetric measurement apparatus, a thermal analysis system TA7000 and a differential thermal gravimetry simultaneous measurement apparatus STA7200, both of which were manufactured by Hitachi High-Tech Science Co., Ltd., were used. In an air atmosphere in which an Air gas flows at a flow rate of 200 mL/min, the titanium dioxide particle is heated from room temperature to 800° C. at a temperature rising rate of 20° C./min to determine the weight change thereof. Under the same conditions, the photocatalyst particle according to the present disclosure is heated to determine the weight change thereof. The weight change of the single layer 201 of the carbon-based precipitate is determined from the difference between the two weight changes. By raising the temperature of the photocatalyst particle according to the present disclosure to 800° C. in air, the single layer 201 of the carbon-based precipitate on the surface of the photocatalyst is burned to lower the weight of the photocatalyst particle. The coverage ratio can be determined from the charged amount in the thermogravimetric analyzer, the change in density and weight of the single layer 201 of the carbon-based precipitate, and the surface area of the titanium dioxide particle 202.

Figure 3:
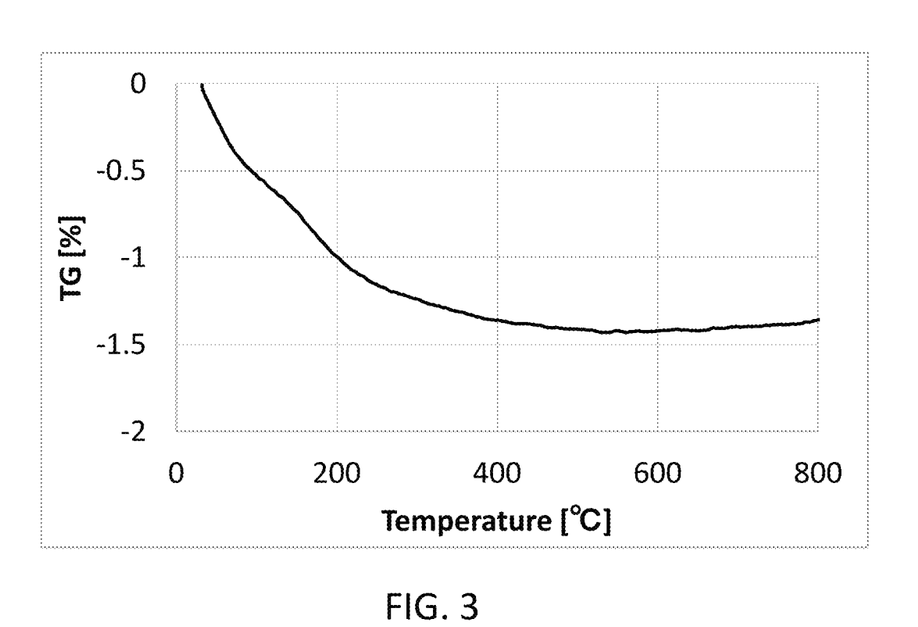
FIG. 3 is a diagram showing results of thermogravimetric analysis of titanium dioxide used for fabricating the photocatalytic material in the first embodiment of the present disclosure.

FIG. 3 is a diagram showing the results of thermogravimetric analysis of the titanium dioxide used for fabricating the photocatalytic material.

The weight change of the titanium dioxide particles by thermogravimetric analysis is due to the evaporation of moisture in the air in which the titanium dioxide particles have absorbed the moisture due to the heating of the titanium dioxide particles.

Figure 4:
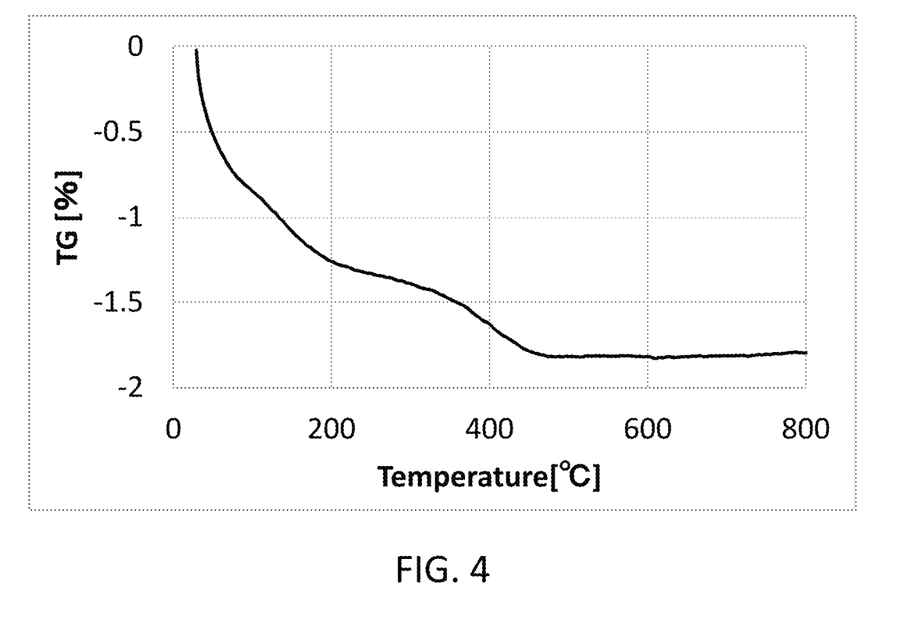
FIG. 4 is a diagram showing results of thermogravimetric analysis of the photocatalytic material in the first embodiment of the present disclosure.

FIG. 4 is a diagram showing the results of the thermogravimetric analysis of the photocatalyst material of the present disclosure.

The change in weight of the photocatalytic material by the thermogravimetric analysis is due to the combustion of the carbon-based precipitate deposited on the surface of the titanium dioxide and the evaporation of the moisture absorbed by the photocatalytic material. Here, comparing the results of thermogravimetric analysis shown in FIG. 3 and FIG. 4, the differences of the average values of the respective weight changes of the titanium dioxide and the photocatalytic material to 800° C. are determined. In this way, the weight change by combustion of the carbon-based precipitate which coats a photocatalyst material can be calculated. As a result of the calculation, the ratio of the weight change of the photocatalytic material due to the combustion of the carbon-based precipitate was 0.45 wt %. The charged amount of the photocatalytic material to the thermogravimetric analyzer was 3 mg, the surface area of the titanium dioxide was 50 m$^2$/g, the density of the carbon-based precipitate was 2 g/cm$^3$, the thickness of one layer of graphene was 0.4 nm. Using these values, the coverage ratio of the carbon-based precipitate on the surface of the titanium dioxide particle was calculated. As a result, the coverage ratio was 0.11 ML (Mono Layer). Here, a state in which the single layer of the carbon-based precipitate covers the entire surface of the titanium dioxide particle is referred to as 1 ML. Therefore, the coverage ratio of 0.11 ML indicates that 11% of the surface of the titanium dioxide particle is covered with the single layer of carbon-based precipitate.

Figure 5:
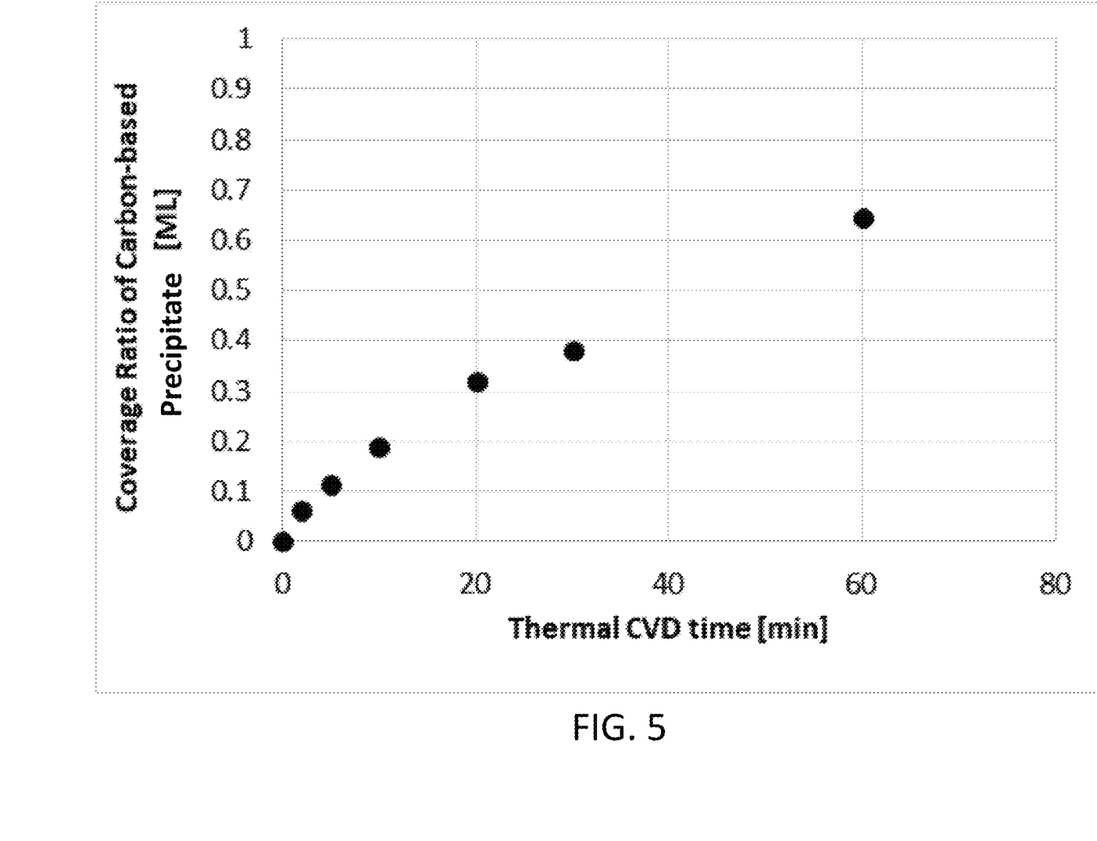
FIG. 5 is a diagram showing time change of a coverage ratio of a carbon-based precipitate on titanium dioxide in the first embodiment of the present disclosure.

FIG. 5 is a diagram showing the time change of the coverage ratio of the carbon-based precipitate on the titanium dioxide. Under each condition where the CVD time was changed, the coverage ratio by the carbon-based precipitate was not more than 1 ML. Therefore, the surface of the photocatalytic material fabricated in the present embodiment, has a portion where the surface of titanium dioxide is exposed and a portion where the surface of titanium dioxide is covered with the single layer of the carbon-based precipitate.

After the photocatalyst is dispersed in an aqueous solution containing an organic substance and irradiated with light, the activity of the photocatalyst can be evaluated by analyzing the concentration change of the organic substance. As an example, formic acid, which is an organic substance, was used to evaluate the photocatalytic activity as below. The fabricated photocatalyst was weighed 25 mg and mixed with an aqueous formic acid solution adjusted to 10 mg/L. Using an ultrasonic cleaner, an ultrasonic wave was applied for 1 minute to disperse the photocatalyst. The mixture was stirred for 1 hour with a magnetic stirrer. After stirring, 5 mL of the mixture was put in a Teflon cell, and then, irradiated with an ultraviolet light having a wavelength of 350 nm at an irradiation intensity of 1 mW/cm$^2$. As a result, the formic acid was decomposed due to the photocatalytic reaction. The formic acid concentration was decreased for 6 minutes to reach not more than 0.1 mg/L. When the concentration change of the formic acid due to the photocatalytic reaction was fitted using a first-order reaction rate equation, the reaction rate constant was 0.48 min$^{-1}$.

Figure 6:
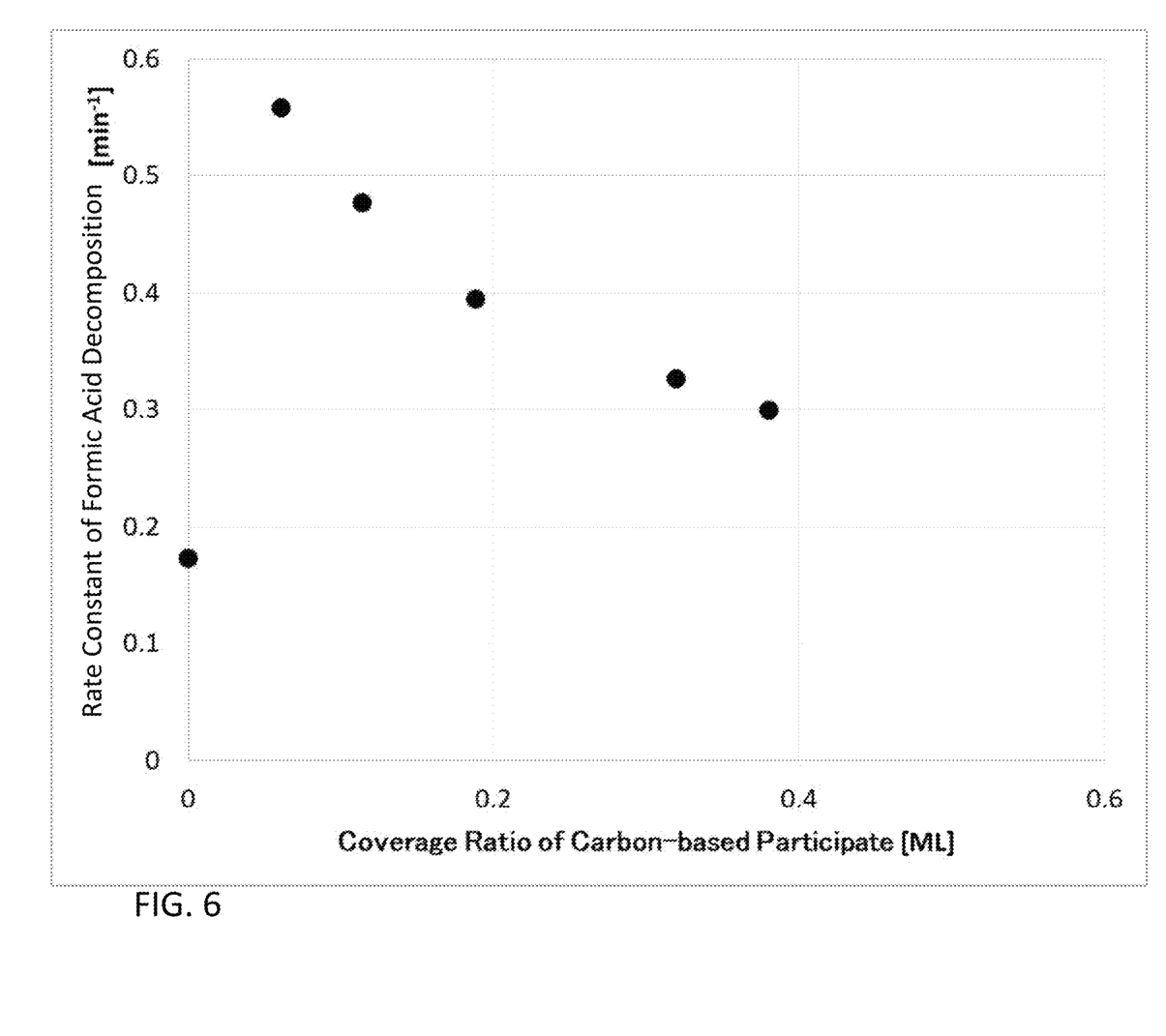
FIG. 6 is a diagram showing a relationship between the coverage ratio of the carbon-based precipitate and a formic acid decomposition rate in the first embodiment of the present disclosure.

FIG. 6 is a diagram showing the relationship between the coverage ratio of the carbon-based precipitate and the formic acid decomposition rate. It can be seen from FIG. 6 that the preferable range of the coverage ratio of the carbon-based precipitate is 5 to 40%.

The plot at the coverage ratio of 0 ML indicates the result of a measurement using the titanium dioxide particles "P25" in the comparative example which will be described later.

From the results of the photocatalytic activity evaluation, it can be seen that, among the photocatalysts coated with the single layer of the carbon-based precipitate, as the coverage ratio thereof is smaller, the photocatalytic activity thereof is higher. Positive effects on the photocatalytic activity would be stabilization of excited electrons by the carbon-based precipitate 201 on the surface of the titanium dioxide particle 202 and an adsorption and concentration effect of a reactant. Negative effects would be inhibition of the light absorption of the photocatalyst by the carbon-based precipitate 201 and a decrease in an adsorption site of a molecule on which a reaction occurs upon adsorption directly on the photocatalyst surface. The photocatalytic activity is considered to be determined by the balance of these positive and negative effects. When the coverage ratio is small, the positive effect affects the photocatalytic activity significantly, since the negative effect is small. As above described, it can be seen that covering the photocatalyst with multilayer graphene as disclosed in Patent Literature 1 leads to a decrease in activity.

Improvement in chemical durability can also be expected by forming the carbon-based precipitate 201 containing graphene on the surface of titanium dioxide. The carbon-based precipitate 201 on the photocatalyst surface in the present disclosure contains a graphene structure composed of carbon of sp$^2$ hybrid orbital. Graphene is a layered compound having a chemically inert surface. Since graphene has no dangling bond (unpaired electron) in the direction perpendicular to the surface thereof, chemical adsorption of ions hardly occurs. Therefore, in water, the effect which suppresses the decrease in the photocatalytic activity due to the chemical adsorption of a metal salt or oxide on the surface of the photocatalyst can be expected.

In addition, as a comparative example, in accordance with the method for evaluating the photocatalytic activity described in the first embodiment, a photocatalyst reaction experiment of formic acid decomposition was performed using "P25", which is a titanium dioxide particle which is not coated with the single layer of the carbon-based precipitate. In the comparative example, the rate constant was 0.17 min$^{-1}$.

INDUSTRIAL APPLICABILITY

The photocatalyst material according to the present disclosure can be used not only for environmental purification such as water purification and air purification but also for organic synthesis in which the photocatalytic reaction is involved.

REFERENTIAL SIGNS LIST

201 Carbon-based precipitate
202 Titanium dioxide particle

The invention claimed is:

1. A fabrication method of a photocatalytic material, the method comprising:
   (a) loading titanium dioxide particles into an electric furnace comprising a mechanism for rotating a core tube;
   (b) heating an inside of the core tube of the electric furnace into which the titanium dioxide particles have been loaded to a temperature of not less than 400° C. and not more than 800° C., while an inert gas is introduced into the inside of the core tube, wherein the heating brings the titanium dioxide particles into a fluidized state;
   (c) supplying a hydrocarbon gas at a temperature of not less than 400° C. and not more than 800° C. to the inside of the core tube in addition to the inert gas; and
   (d) performing a thermal CVD at a temperature of not less than 400° C. and not more than 800° C. on each of the titanium dioxide particles in the fluidized state inside the core tube, while the core tube is rotated, to form a single layer of a carbon-based precipitate containing graphene on a surface of each of the titanium dioxide particles,
   wherein the single layer of the carbon-based precipitate covers 5% to 40% of the surface of each of the titanium dioxide particles.

2. The fabrication method of the photocatalytic material according to claim 1, wherein
   a thickness of the single layer of the carbon-based precipitate is not more than 0.5 nm.

3. The fabrication method of the photocatalytic material according to claim 1, wherein
   the thermal CVD is performed for 10 minutes to 60 minutes.

4. The fabrication method of the photocatalytic material according to claim 1, wherein
   the inert gas is nitrogen gas.

5. The fabrication method of the photocatalytic material according to claim 1, wherein
   the hydrocarbon gas contains an alkene gas.

6. The fabrication method of the photocatalytic material according to claim 5, wherein
   the alkene gas is propylene.

7. The fabrication method of the photocatalytic material according to claim 1, wherein
   the hydrocarbon gas is provided by bubbling the inert gas into an alcohol.

8. The fabrication method of the photocatalytic material according to claim 7, wherein
   the alcohol is methanol or ethanol.

* * * * *